United States Patent
Sunohara

(10) Patent No.: US 10,187,986 B2
(45) Date of Patent: Jan. 22, 2019

(54) WIRING SUBSTRATE INCLUDING VIA INTERCONNECT WHOSE SIDE SURFACE INCLUDES PROJECTION

(71) Applicant: SHINKO ELECTRIC INDUSTRIES CO., LTD., Nagano (JP)

(72) Inventor: Satoshi Sunohara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/890,407

(22) Filed: Feb. 7, 2018

(65) Prior Publication Data
US 2018/0279472 A1    Sep. 27, 2018

(30) Foreign Application Priority Data
Mar. 24, 2017    (JP) ................. 2017-058890

(51) Int. Cl.
H05K 1/11    (2006.01)
H05K 3/46    (2006.01)
H05K 3/40    (2006.01)

(52) U.S. Cl.
CPC .......... *H05K 1/115* (2013.01); *H05K 3/4076* (2013.01); *H05K 3/4644* (2013.01); *H05K 2201/096* (2013.01); *H05K 2201/09827* (2013.01)

(58) Field of Classification Search
CPC .... H05K 1/115; H05K 3/4076; H05K 3/4644; H05K 2201/096; H05K 2201/09827
USPC ....................................................... 174/251
See application file for complete search history.

(56) References Cited

U.S. PATENT DOCUMENTS

| | | | | |
|---|---|---|---|---|
| 6,631,546 | B1 * | 10/2003 | Dinan | C25D 5/022 216/22 |
| 7,123,443 | B2 * | 10/2006 | Dinan | C25D 5/022 360/125.41 |
| 7,190,078 | B2 * | 3/2007 | Khandekar | H01L 21/486 257/621 |
| 7,892,441 | B2 * | 2/2011 | Pai | H01L 21/486 216/18 |
| 9,538,664 | B2 * | 1/2017 | Yanagisawa | H05K 3/0035 |
| 2008/0308307 | A1 * | 12/2008 | Chang | H05K 3/108 174/257 |

(Continued)

FOREIGN PATENT DOCUMENTS

JP    H05-110259    4/1993

*Primary Examiner* — Timothy Thompson
*Assistant Examiner* — Michael F McAllister
(74) *Attorney, Agent, or Firm* — IPUSA, PLLC

(57) ABSTRACT

A wiring substrate includes a first wiring layer on a surface of a first insulating layer; a via interconnect including a first portion connected to the first wiring layer and a second portion formed monolithically with the first portion and extending from an end of the first portion in a direction away from the first wiring layer; a second insulating layer on the first insulating layer; and a second wiring layer on the second insulating layer, contacting a first surface of the second portion. The area of a cross section of the first portion, parallel to the surface of the first insulating layer, increases as the position of the cross section approaches the first wiring layer from the second portion. The second portion includes a second surface that is opposite from its first surface and extends horizontally from the end of the first portion to overhang the first portion.

6 Claims, 7 Drawing Sheets

(56) References Cited

U.S. PATENT DOCUMENTS

| | | | |
|---|---|---|---|
| 2010/0323297 A1* | 12/2010 | Yanagisawa | G02B 6/43 430/315 |
| 2014/0182920 A1* | 7/2014 | Yanagisawa | H05K 3/0035 174/266 |
| 2014/0261661 A1* | 9/2014 | Babayan | H01L 31/022425 136/256 |
| 2015/0000958 A1* | 1/2015 | Harr | H05K 3/4647 174/251 |
| 2015/0257262 A1* | 9/2015 | Lee | H05K 3/107 174/251 |
| 2016/0268188 A1* | 9/2016 | Kariya | H01L 23/3121 |
| 2017/0301639 A1* | 10/2017 | Hiatt | H01L 21/6835 |

* cited by examiner

WIRING SUBSTRATE INCLUDING VIA INTERCONNECT WHOSE SIDE SURFACE INCLUDES PROJECTION

CROSS-REFERENCE TO RELATED APPLICATION

This application is based upon and claims the benefit of priority of the prior Japanese Patent Application No. 2017-058890, filed on Mar. 24, 2017, the entire contents of which are incorporated herein by reference.

FIELD

A certain aspect of the embodiment discussed herein is related to wiring substrates.

BACKGROUND

In build-up wiring substrates in which wiring layers and insulating layers are alternately stacked, an upper wiring layer and a lower wiring layer are connected through, for example, cylindrical via interconnects formed of copper (Cu) or the like.

For example, cylindrical via interconnects are formed in the following manner. First, a wiring layer is formed on an insulating layer, and a resist layer is formed on the insulating layer to cover the wiring layer. Then, cylindrical openings are formed in the resist layer to expose an upper surface of the wiring layer. The openings are filled with metal by electroplating or the like to form cylindrical via interconnects, and the resist layer is removed. Thereafter, an upper insulating layer is formed to cover the wiring layer and the via interconnects, and an upper wiring layer is further formed on the upper insulating layer to connect to the wiring layer through the via interconnects. (See, for example, Japanese Laid-open Patent Publication No. 5-110259.)

SUMMARY

According to an aspect of the present invention, a wiring substrate includes a first wiring layer on a surface of a first insulating layer; a via interconnect on a surface of the first wiring layer, the via interconnect including a first portion connected to the first wiring layer, and a second portion formed together with the first portion as one piece, the second portion extending from an end of the first portion in a direction away from the first wiring layer; a second insulating layer on the first insulating layer, the second insulating layer covering the surface of the first wiring layer, a side surface of the first wiring layer, and a side surface of the via interconnect; and a second wiring layer on the second insulating layer and in contact with a first surface of the second portion of the via interconnect. The area of a cross section of the first portion increases as the position of the cross section approaches the first wiring layer from the second portion. The cross section is parallel to the surface of the first insulating layer. The second portion includes a second surface opposite from its first surface. The second surface extends horizontally from the end of the first portion to overhang the first portion.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
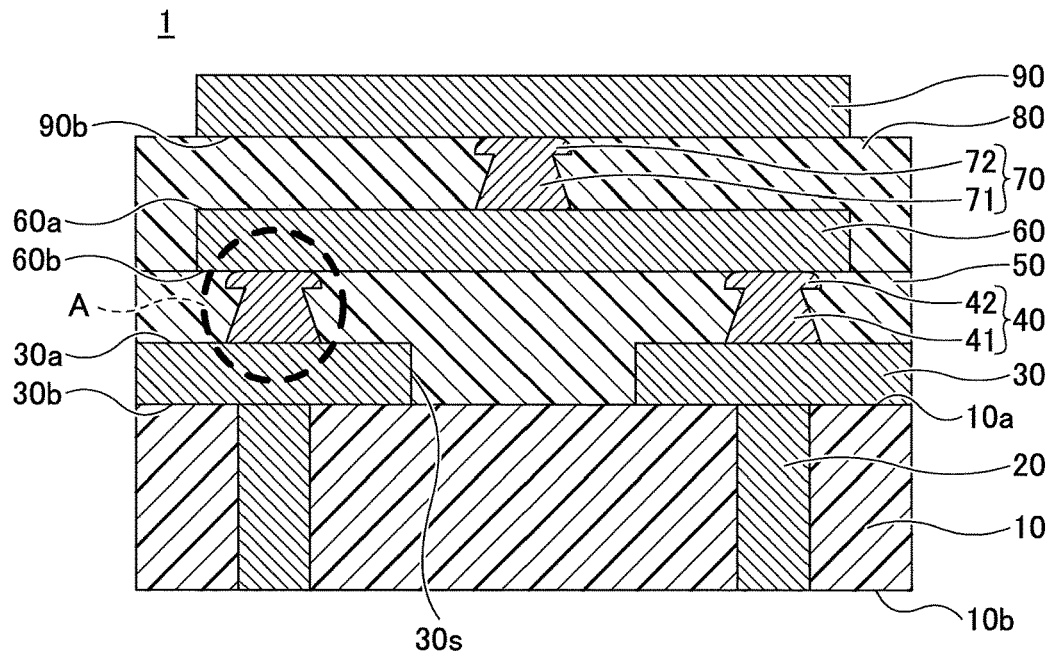
FIGS. 1A and 1B are sectional views of a wiring substrate according to a first embodiment.

The cylindrical via interconnect as described above has a smooth side surface that is vertically formed. Therefore, no part of the cylindrical via interconnect serves as an anchor between the cylindrical via interconnect and an insulating layer covering the cylindrical via interconnect. Accordingly, the cylindrical via interconnect can be easily pulled from the insulating layer, thus being less reliable.

According to an aspect of the present invention, a wiring substrate including a via interconnect so shaped as to be less likely to be pulled from an insulating layer is provided.

One or more preferred embodiments of the present invention will be explained with reference to accompanying drawings. In the drawings, the same elements are referred to using the same reference numeral, and a repetitive description thereof may be omitted.

Figure 1B:
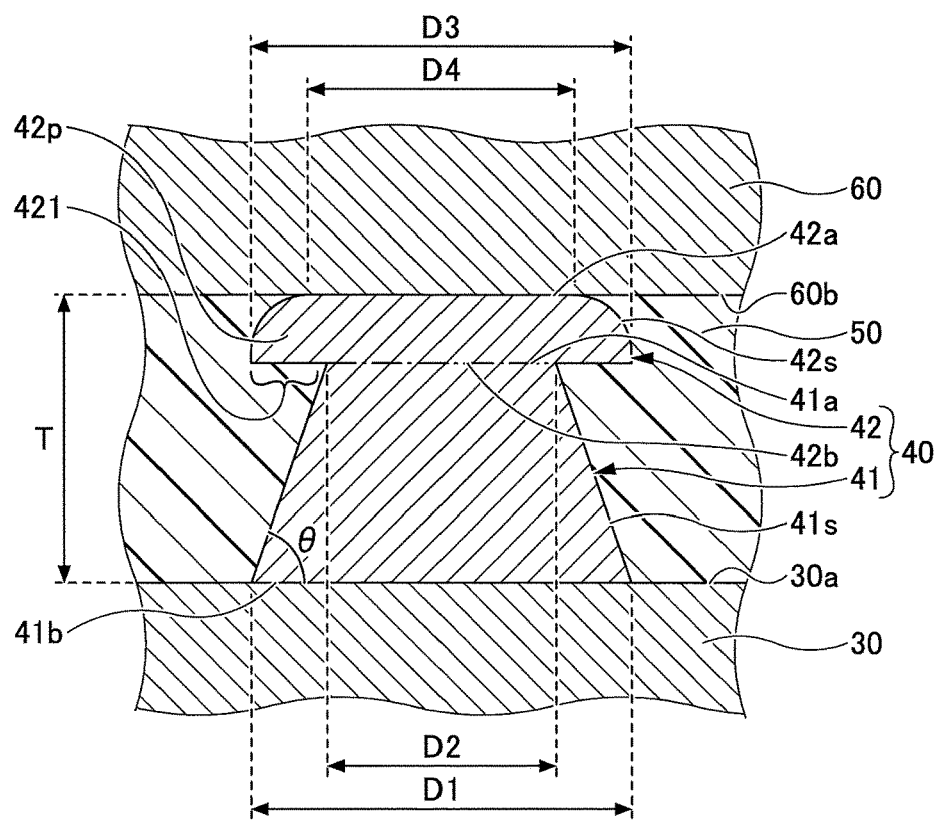

A structure of a wiring substrate according to a first embodiment is described below. FIG. 1A is a sectional view of the entirety of the wiring substrate. FIG. 1B is an enlarged view of part A of FIG. 1A.

Referring to FIGS. 1A and 1B, a wiring substrate 1 is a build-up wiring substrate that includes an insulating layer 10, through vias 20, a wiring layer 30, via interconnects 40, an insulating layer 50, a wiring layer 60, a via interconnect 70, an insulating layer 80, and a wiring layer 90.

According to this embodiment, for convenience of description, the wiring layer 90 side of the wiring substrate 1 is referred to as "upper side" or "first side," and the insulating layer 10 side of the wiring substrate 1 is referred to as "lower side" or "second side." Furthermore, with respect to each part or element of the wiring substrate 1, a surface on the wiring layer 90 side is referred to as "upper surface" or "first surface," and a surface on the insulating layer 10 side is referred to as "lower surface" or "second surface." The wiring substrate 1, however, may be used in an inverted position or oriented at any angle. Furthermore, a plan view refers to a view of an object taken in a direction normal to an upper surface 10a of the insulating layer 10, and a planar shape refers to the shape of an object viewed in a direction normal to the upper surface 10a of the insulating layer 10. A direction normal to the upper surface 10a of the insulating layer 10 may be a direction in which the insulating layer 10, the wiring layer 30, the insulating layer 50, the wiring layer 60, the insulating layer 80, and the wiring layer 90 are stacked. Furthermore, a cross section of an object refers to a section formed by cutting the object along a plane parallel to the upper surface 10a of the insulating layer 10.

The insulating layer 10 is an insulating layer serving as a core. Suitable materials for the insulating layer 10 include, for example, non-photosensitive (thermosetting) epoxy insulating resins, non-photosensitive (thermosetting) phenolic insulating resins, photosensitive epoxy insulating resins, and photosensitive acrylic insulating resins. The insulating layer 10 may include a reinforcing member such as glass cloth. Furthermore, the insulating layer 10 may contain a filler such as silica ($SiO_2$). The thickness of the insulating layer 10 may be, for example, approximately 50 μm to approximately 2000 μm.

The through vias 20 are provided through the insulating layer 10. The lower end faces of the through vias 20 are exposed at a lower surface 10b of the insulating layer 10. The lower end faces of the through vias 20 may be used as external connection terminals. Alternatively, a wiring layer may be provided on the lower surface 10b of the insulating layer 10 to connect to the lower end faces of the through vias 20. As yet another alternative, one or more wiring layers and one or more insulating layers may be alternately stacked on the lower surface 10b of the insulating layer 10. Suitable materials for the through vias 20 include, for example, copper (Cu).

The wiring layer 30 is formed on the insulating layer 10. A lower surface 30b of the wiring layer 30 connects to (directly contacts) the upper end faces of the through vias 20. Suitable materials for the wiring layer 30 include, for example, copper (Cu). The thickness of the wiring layer 30 may be, for example, approximately 10 μm to approximately 30 μm.

The via interconnects 40 are formed on the wiring layer 30. Each via interconnect 40 includes a first via portion 41 (first portion) and a second via portion 42 (second portion) that are monolithically formed, namely, formed together as one piece. The first via portion 41 connects to (directly contacts) an upper surface 30a of the wiring layer 30. The second via portion 42 is on the first via portion 41 and connects to (directly contacts) a lower surface 60b of the wiring layer 60. That is, the second via portion 42 extends from the first via portion 41 in a direction away from the wiring layer 30. Suitable materials for the first via portion 41 and the second via portion 42 include, for example, copper (Cu). In the following description, the via interconnects 40 may be collectively referred to as "via interconnect 40" where a description is common to the via interconnects 40.

In FIG. 1B, the boundary between the first via portion 41 and the second via portion 42 is conveniently indicated by a horizontal one-dot chain line. A cross section of the via interconnect 40 taken along the one-dot chain line corresponds to the upper end of the first via portion 41, and may be referred to, for convenience purposes, as an upper end face 41a of the first via portion 41. Actually, however, there is no interface between the first via portion 41 and the second via portion 42, which are formed together as one piece as described above.

The cross-sectional area of the first via portion 41 increases as the position of the cross section approaches the wiring layer 30 from the second via portion 42. That is, the first via portion 41 increases in cross-sectional area toward its lower end or a lower end face 41b. In a sectional view, a side surface 41s of the first via portion 41 may be rectilinearly inclined or inwardly or outwardly curved. The planar shape of the upper end face 41a and the lower end face 41b of the first via portion 41 may be one of, but is not limited to, a circle, an ellipse, and a rectangle.

Referring to FIG. 1B, when the planar shape of the upper end face 41a and the lower end face 41b of the first via portion 41 is a circle, a diameter D1 of the lower end face 41b of the first via portion 41 may be, for example, approximately 20 μm to approximately 50 μm, and a diameter D2 of the upper end face 41a of the first via portion 41 may be, for example, approximately 10 μm to approximately 40 μm. In a sectional view, an angle θ between the lower end face 41b of the first via portion 41 (the upper surface 30a of the wiring layer 30) and the side surface 41s of the first via portion 41 may be, for example, approximately, 85 degrees.

The second via portion 42 includes a lower surface 421 that projects horizontally (for example, parallel to the upper surface 10a of the insulating layer 10) outward from the upper end of the first via portion 41 to overhang the side surface 41s of the first via portion 41. The lower surface 421 surrounds the upper end (the upper end face 41a) of the first via portion 41 to have, for example, an annular shape. The lower surface 421 and a cross section of the via interconnect 40 taken along the one-dot chain line form a single plane, which is referred to as a lower end face 42b of the second via portion 42 for convenience purposes. That is, the second via portion 42 virtually has the lower end face 42b that connects to the upper end face 41a of the first via portion 41, which is also virtual, and extends horizontally outward from the upper end of the first via portion 41 to project over the side surface 41s of the first via portion 41. An upper end face 42a of the second via portion 42 connects to (directly contacts) the lower surface 60b of the wiring layer 60.

In other words, the via interconnect 40 includes a side surface that is stepped to form a projection (a peripheral portion 42p of the second via portion 42) that extends horizontally, for example, parallel to the upper surface 10a of the insulating layer 10.

The cross-sectional area of the second via portion 42 increases as the position of the cross section approaches the first via portion 41 from the wiring layer 60. That is, the second via portion 42 increases in cross-sectional area toward its lower end or the lower end face 42b. In a sectional view, a side surface 42s of the second via portion 42 may be rectilinearly inclined or inwardly or outwardly curved. The planar shape of the upper end face 42a and the lower end face 42b of the second via portion 42 may be one of, but is not limited to, a circle, an ellipse, and a rectangle.

Referring to FIG. 1B, when the planar shape of the upper end face 42a and the lower end face 42b of the second via portion 42 is a circle, a diameter D3 of the lower end face 42b of the second via portion 42 may be, for example, approximately 20 μm to approximately 50 μm, and a diameter D4 of the upper end face 42a of the second via portion 42 may be, for example, approximately 10 μm to approximately 40 μm. The thickness of the second via portion 42 may be, for example, approximately 5 μm to approximately 10 μm.

The insulating layer 50 is formed on the insulating layer 10 to cover the upper surface 30a and a side surface 30s of the wiring layer 30 and the side surface of the via interconnect 40 (including the side surface 41s of the first via portion 41 and the lower surface 421 and the side surface 42s of the second via portion 42). That is, the via interconnect 40 is buried in the insulating layer 50 with its upper end (the upper end face 42a of the second via portion 42) in direct contact with the lower surface 60b of the wiring layer 60 and its lower end (the lower end face 41b of the first via portion 41) in direct contact with the upper surface 30a of the wiring layer 30. The material of the insulating layer 50 may be, for example, the same as the material of the insulating layer 10. The insulating layer 50 may include a reinforcing member such as glass cloth and a filler such as silica ($SiO_2$). A thickness T of the insulating layer 50 between the upper surface 30a of the wiring layer 30 and the lower surface 60b of the wiring layer 60 may be, for example, approximately 10 μm to approximately 30 μm. The thickness T of the insulating layer 50 is equal to the height of the via interconnect 40.

The wiring layer 60 is foamed on the insulating layer 50. The lower surface 60b of the wiring layer 60 contacts the upper end face 42a of the second via portion 42. The wiring layer 60 connects to the wiring layer 30 through the via interconnect 40. The material and thickness of the wiring layer 60 may be, for example, the same as the material and thickness of the wiring layer 30.

The via interconnect 70 is formed on the wiring layer 60. The via interconnect 70 includes a first via portion 71 and a second via portion 72 that are monolithically formed, namely, formed together as one piece. The first via portion 71 connects to (directly contacts) an upper surface 60a of the wiring layer 60. The second via portion 72 is on the first via portion 71 and connects to (directly contacts) a lower surface 90b of the wiring layer 90. The shape, size, and material of the via interconnect 70 may be, for example, the same as the shape, size, and material of the via interconnect 40.

The insulating layer 80 is formed on the insulating layer 50 to cover the upper surface 60a and the side surface of the wiring layer 60 and the side surface of the via interconnect 70. The material and thickness of the insulating layer 80 may be, for example, the same as the material and thickness of the insulating layer 10. The thickness of the insulating layer 80 is equal to the height of the via interconnect 70.

The wiring layer 90 is formed on the insulating layer 80. The lower surface 90b of the wiring layer 90 contacts the upper end face of the second via portion 72. The wiring layer 90 connects to the wiring layer 60 through the via interconnect 70. The material and thickness of the wiring layer 90 may be, for example, the same as the material and thickness of the wiring layer 30.

One or more sets of a via interconnect, an insulating layer, and a wiring layer may be further stacked on the wiring layer 90.

Next, a method of manufacturing a wiring substrate according to the first embodiment is described. FIGS. 2A through 2J are diagrams illustrating a process of manufacturing a wiring substrate according to the first embodiment. While a process of forming a single wiring substrate is illustrated in this embodiment, as an alternative process, multiple structures to become wiring substrates may be collectively formed and thereafter divided into individual wiring substrates.

Figure 2A:
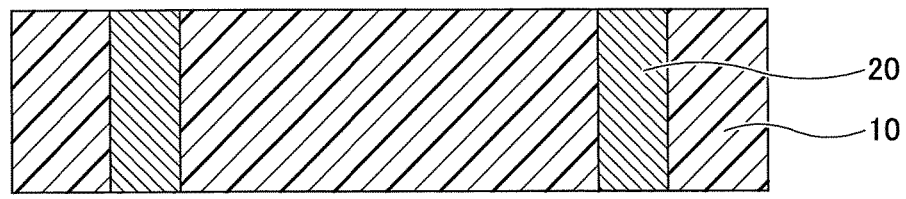
FIGS. 2A through 2J are diagrams illustrating a process of manufacturing a wiring substrate according to the first embodiment.

First, in the process depicted in FIG. 2A, the insulating layer 10 is prepared, and through holes are formed in the insulating layer 10. The through holes are filled with metal such as copper (Cu) to form the through vias 20. The material and thickness of the insulating layer 10 are as described above.

Figure 2B:
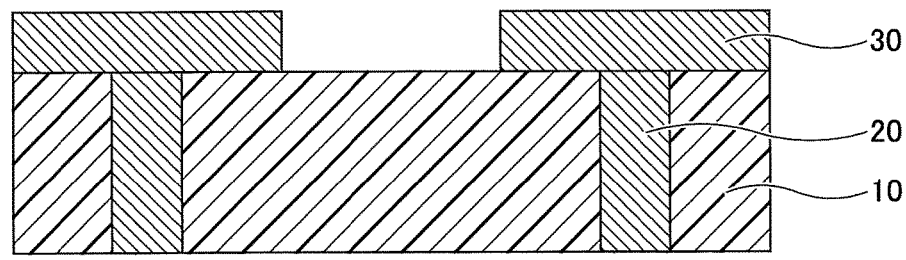

Next, in the process depicted in FIG. 2B, the wiring layer 30 is formed on the insulating layer 10 to connect to the through vias 20. The wiring layer 30 may be formed using a wiring forming process among various wiring forming processes such as a semi-additive process and a subtractive process. The material and thickness of the wiring layer 30 are as described above.

Figure 2C:
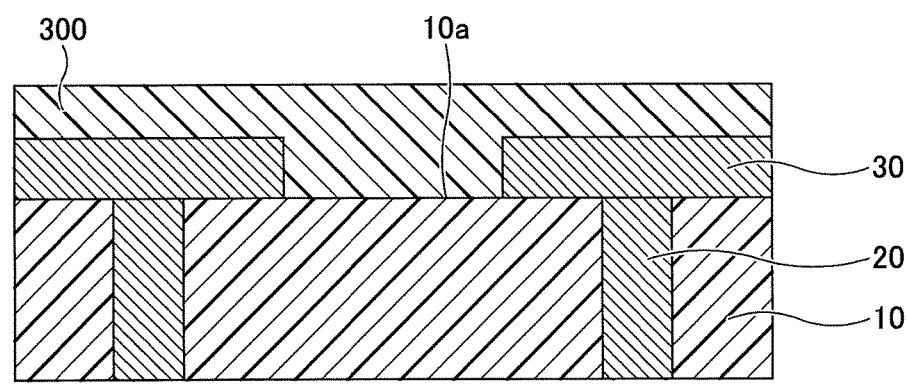
Figure 2D:
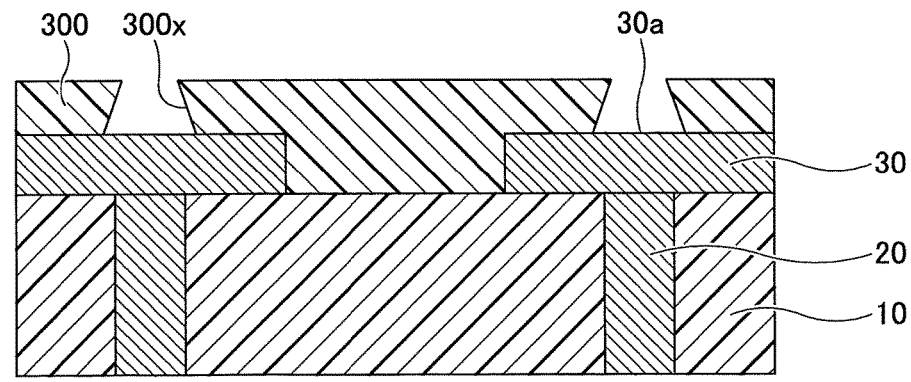

Next, in the process depicted in FIG. 2C, a resist layer 300 is formed on the insulating layer 10 to cover the wiring layer 30. Then, in the process depicted in FIG. 2D, openings 300x having a cross section whose area increases as the position of the cross section approaches the wiring layer 30 (namely, toward the bottom of the openings 300x) are formed in the resist layer 300 to expose the upper surface 30a of the wiring layer 30. The openings 300x are hereinafter collectively referred to as "opening 300x" for convenience of description.

The resist layer 300 may be formed by, for example, laminating the upper surface 10a of the insulating layer 10 with a film resist formed of a photosensitive resin (such as a photosensitive epoxy or acrylic resin). The resist layer 300 may alternatively be formed by, for example, applying a liquid or paste resist formed of a photosensitive resin (such as a photosensitive epoxy or acrylic resin) on the upper surface 10a of the insulating layer 10 and thereafter drying the applied liquid or paste resist.

When the resist layer 300 is a positive type, the opening 300x whose cross-sectional area increases toward the bottom can be formed by controlling the amount of exposure to light so that the amount of exposure to light is more than normally is. When the resist layer 300 is a negative type, the opening 300x whose cross-sectional area increases toward the bottom can be formed by controlling the amount of exposure to light so that the amount of exposure to light is less than normally is.

Figure 2E:
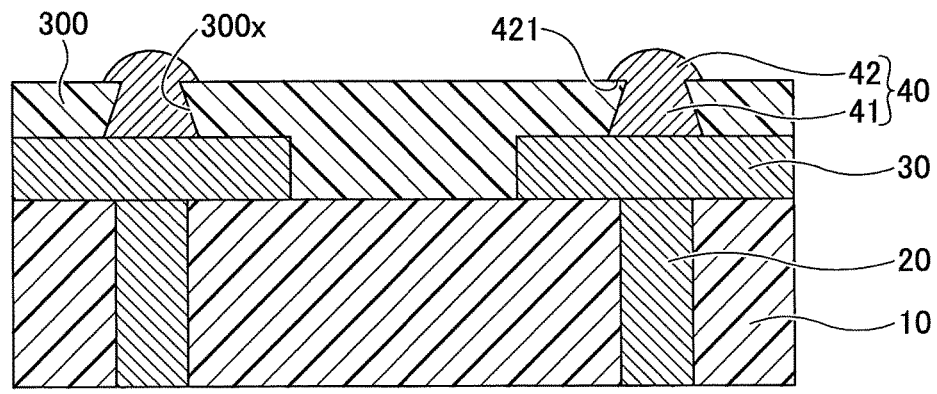

Next, in the process depicted in FIG. 2E, the opening 300x is filled with metal such as copper (Cu), and the metal is caused to protrude from the upper surface of the resist layer 300. As a result, the first via portion 41 filling in the opening 300x and the second via portion 42 having the lower surface 421 projecting horizontally outward from the upper end of the first via portion 41 to overhang the first via portion 41 are formed of the metal. At this point, the first via portion 41 and the second via portion 42 together have a mushroom shape. At this point, the second via portion 42 has a dome shape or the shape of a substantial sphere whose part is cut off. The first via portion 41 and the second via portion 42 may be formed by, for example, depositing more metal such as copper (Cu) than the volume of the opening 300x by electroplating, using the wiring layer 30 as a power feed layer.

Figure 2F:
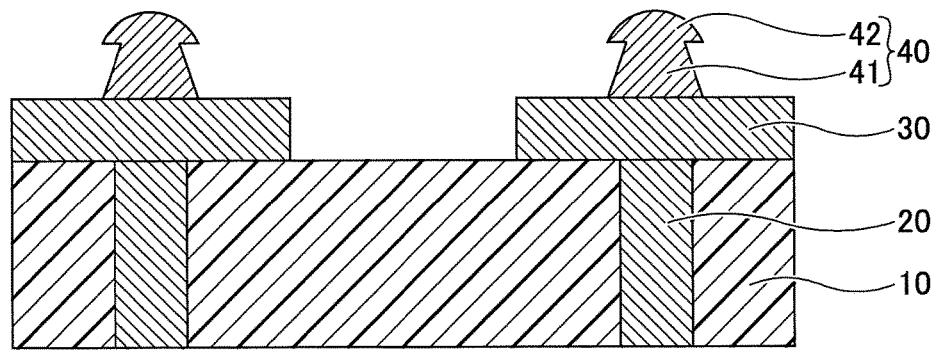
Figure 2G:
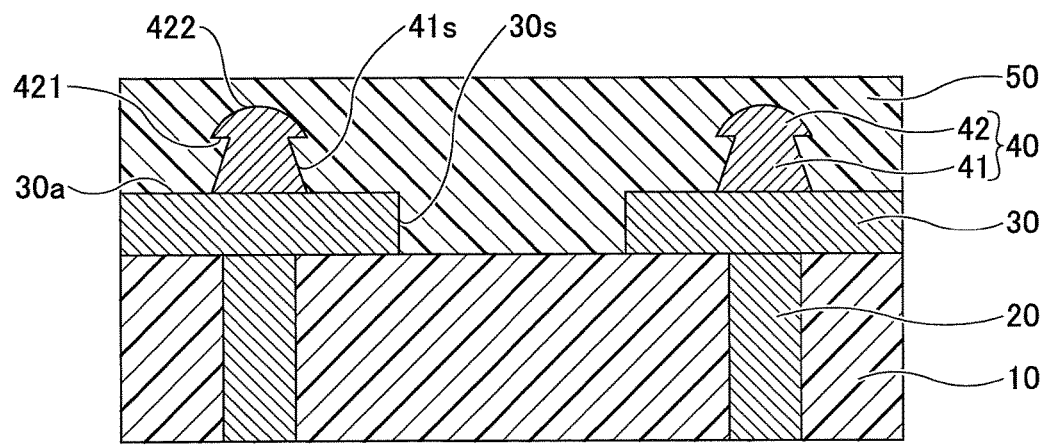

Next, in the process depicted in FIG. 2F, the resist layer 300 is removed, using, for example, a predetermined stripping solution. Then, in the process depicted in FIG. 2G, the insulating layer 50 is formed on the insulating layer 10 to cover the upper surface 30a and the side surface 30s of the wiring layer 30, the side surface 41s of the first via portion 41, and a curved upper surface 422 and the lower surface 421 of the second via portion 42. The insulating layer 50 may be foisted by, for example, applying an epoxy or phenolic insulating resin or providing a laminate of an epoxy or phenolic insulating resin. The thickness of the insulating layer 50 is as described above. The curved upper surface 422 of the second via portion 42 includes the side surface 42s.

Figure 2H:
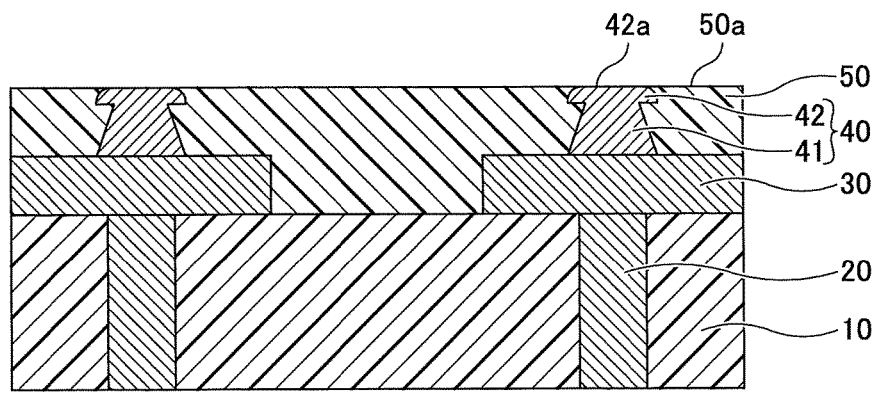

Next, in the process depicted in FIG. 2H, the insulating layer 50 and the second via portion 42 are polished from the opposite side from the insulating layer 10 to expose the upper end face 42a at an upper surface 50a of the insulating layer 50. The polishing may be performed using a process such as chemical-mechanical polishing (CMP), blasting, or buffing. The upper surface 50a of the insulating layer 50 may be, for example, flush with the upper end face 42a of the second via portion 42. In the case of having the upper surface 50a of the insulating layer 50 and the upper end face 42a of the second via portion 42 flush with each other, it is preferable to combine physical polishing and chemical polishing.

Figure 2I:
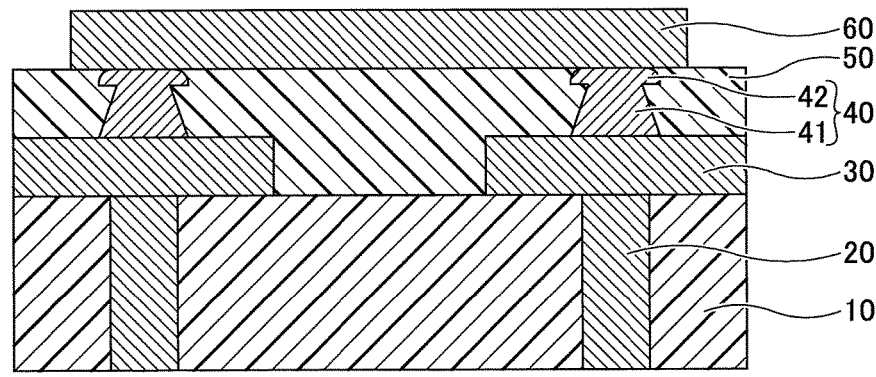

Next, in the process depicted in FIG. 2I, the wiring layer 60 is formed on the insulating layer 50 to connect to the wiring layer 30 through the via interconnect 40. The wiring layer 60 may be formed using a wiring forming process among various wiring forming methods such as a semi-additive process and a subtractive process. The material and thickness of the wiring layer 60 are as described above.

Figure 2J:
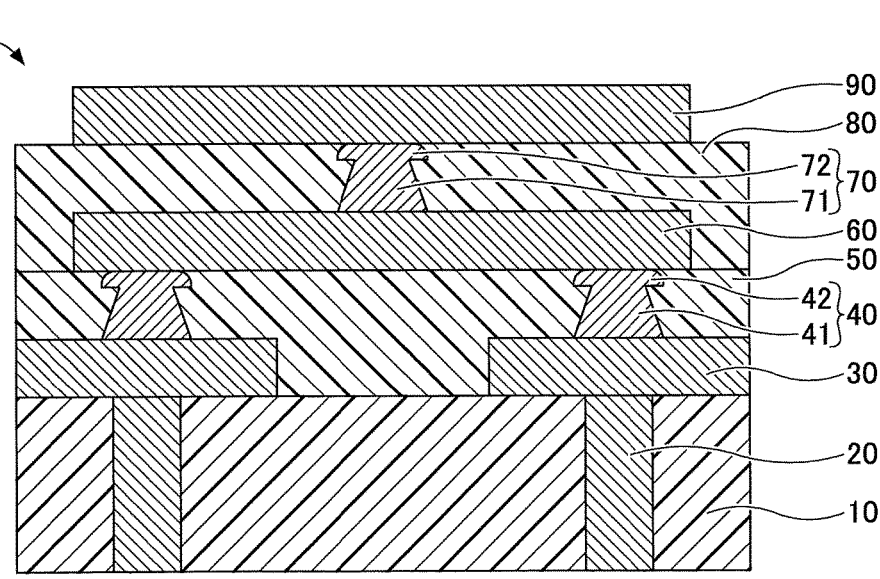

Next, in the process depicted in FIG. 2J, the via interconnect 70, the insulating layer 80, and the wiring layer 90 are formed in the same manner as in FIGS. 2C through 2I. By the above-described process, the wiring substrate 1 illustrated in FIGS. 1A and 1B is completed.

Thus, according to the wiring substrate 1 of the first embodiment, the cross-sectional area of the first via portion 41 increases as the position of the cross section approaches the wiring layer 30 from the second via portion 42. This makes it possible to prevent the via interconnect 40 from being pulled out toward the insulating layer 80.

Furthermore, the wiring substrate 1 includes the second via portion 42 that includes the lower surface 421 projecting horizontally outward from the upper end of the first via portion 41 to overhang the first via portion 41. This makes it possible to prevent the via interconnect 40 from being pulled out toward the insulating layer 10.

In addition, according to the wiring substrate 1, the cross-sectional area of the second via portion 42 increases as the position of the cross section approaches the first via portion 41 from the wiring layer 60. This makes it possible to further prevent the via interconnect 40 from being pulled out toward the insulating layer 80.

[Variation of First Embodiment]

According to a variation of the first embodiment, a via interconnect includes a seed layer. In the following description, the same elements as those of the above-described embodiment are referred to using the same reference numeral, and a repetitive description thereof may be omitted.

Figure 3A:
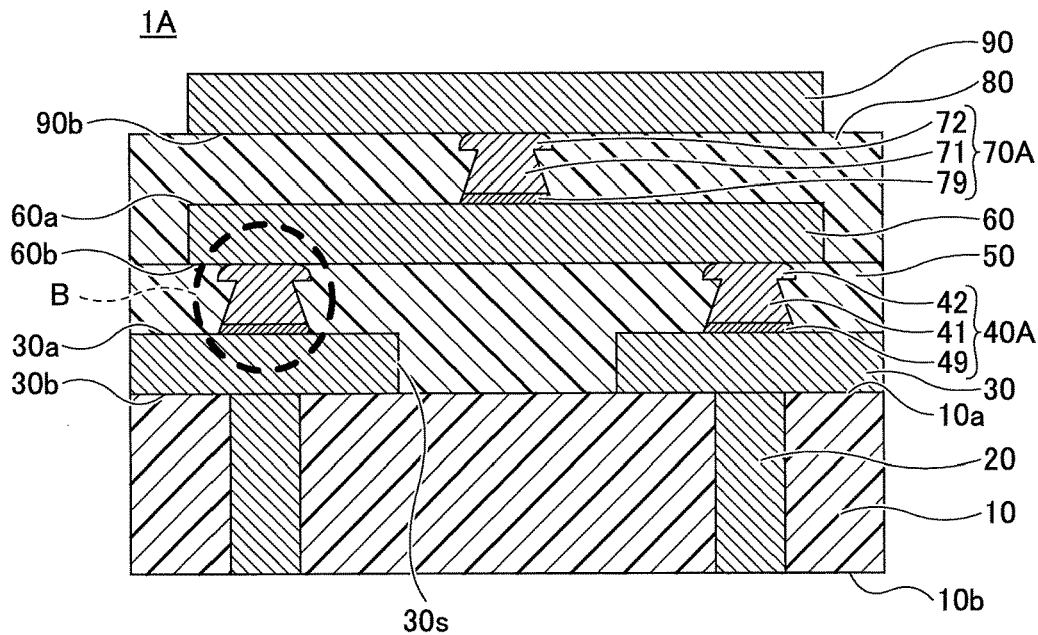
FIGS. 3A and 3B are sectional views of a wiring substrate according to a variation of the first embodiment.
Figure 3B:
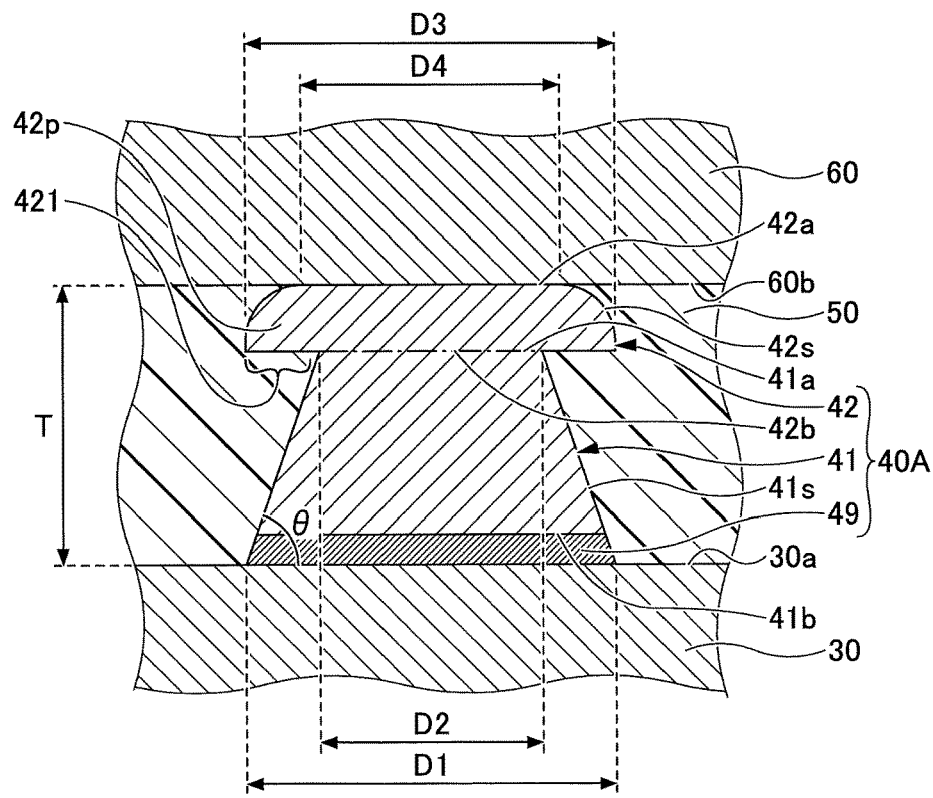

FIG. 3A is a sectional view of the entirety of a wiring substrate according to the variation. FIG. 3B is an enlarged view of part B of FIG. 3A.

Referring to FIGS. 3A and 3B, a wiring substrate 1A of the variation is different from the wiring substrate 1 in that the via interconnects 40 and 70 are replaced with via interconnects 40A and 70A. The via interconnects 40A may be hereinafter collectively referred to as "via interconnect 40A" where a description is common to the via interconnects 40A.

The via interconnect 40A includes a seed layer 49, the first via portion 41 formed on the seed layer 49, and the second via portion 42 formed on the first via portion 41. The seed layer 49 connects to (directly contacts) the upper surface 30a of the wiring layer 30. The second via portion 42 is formed together with the first via portion 41 as one piece, and connects to the lower surface 60b of the wiring layer 60. Suitable materials for the seed layer 49 include, for example, copper (Cu). The thickness of the seed layer 49 may be, for example, approximately 1 μm or less. The via interconnect 70A includes a seed layer 79, the first via portion 71, and the second via portion 72, and has the same structure as the via interconnect 40A.

Figure 4A:
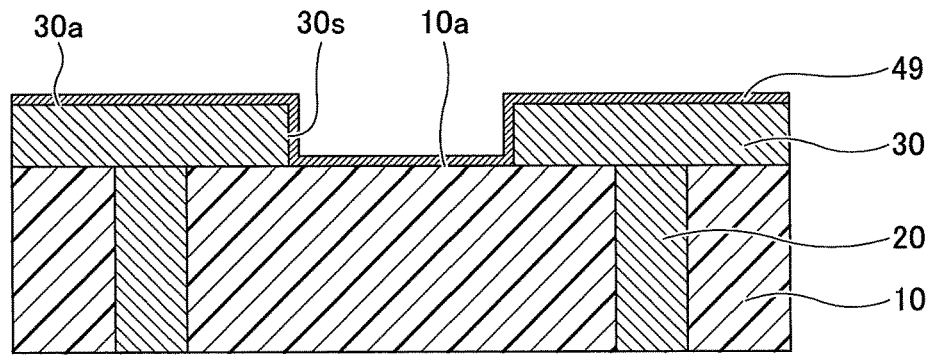
FIGS. 4A through 4E are diagrams illustrating a process of manufacturing a wiring substrate according to the variation of the first embodiment.

For example, the following process may be executed to manufacture the wiring substrate 1A. First, after execution of the processes of FIGS. 2A and 2B of the first embodiment, in the process depicted in FIG. 4A, the seed layer 49 is formed by, for example, electroless plating or sputtering to cover the upper surface 10a of the insulating layer 10 and the upper surface 30a and the side surface 30s of the wiring layer 30.

Figure 4B:
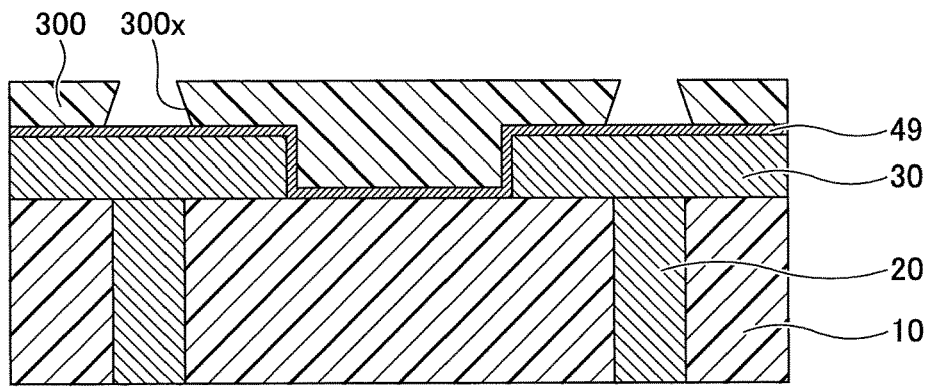

Next, in the process depicted in FIG. 4B, the resist layer 300 is formed on the seed layer 49 the same as in the process depicted in FIG. 2C. Then, the same as in the process depicted in FIG. 2D, the opening 300x whose cross-sectional area increases as the position of the cross section approaches the seed layer 49 is formed in the resist layer 300 to expose the upper surface of the seed layer 49.

Figure 4C:
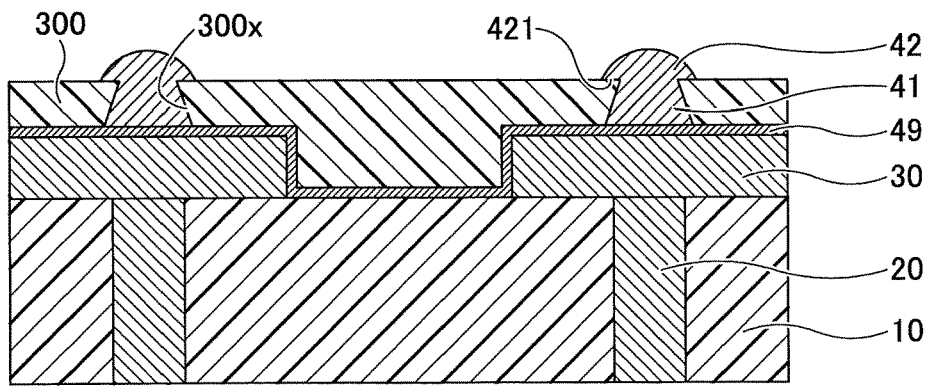

Next, in the process depicted in FIG. 4C, electroplating is performed, using the seed layer 49 as a power feed layer, to fill the opening 300x with metal such as copper (Cu) and protrude the metal from the upper surface of the resist layer 300. As a result, the first via portion 41 filling in the opening 300x and the second via portion 42 having the lower surface 421 projecting horizontally outward from the upper end of the first via portion 41 to overhang the first via portion 41 are formed of the metal. At this point, the first via portion 41 and the second via portion 42 together have a mushroom shape. At this point, the second via portion 42 has a dome shape or the shape of a substantial sphere whose part is cut off.

Figure 4D:
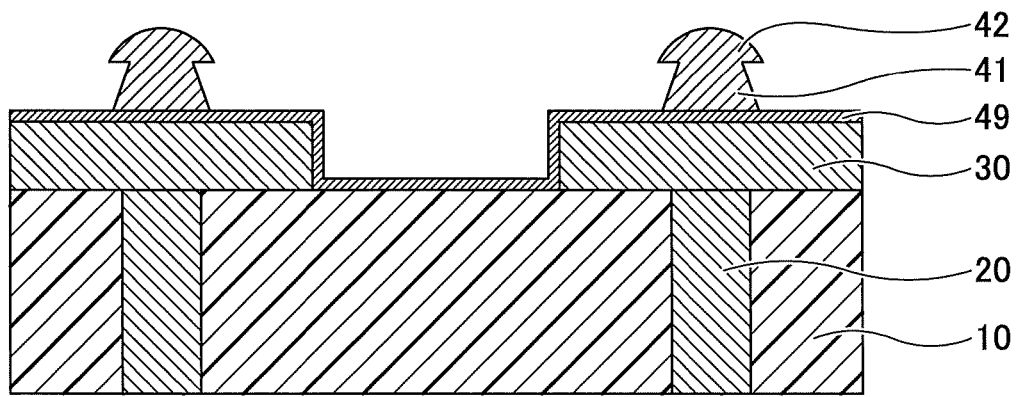
Figure 4E:
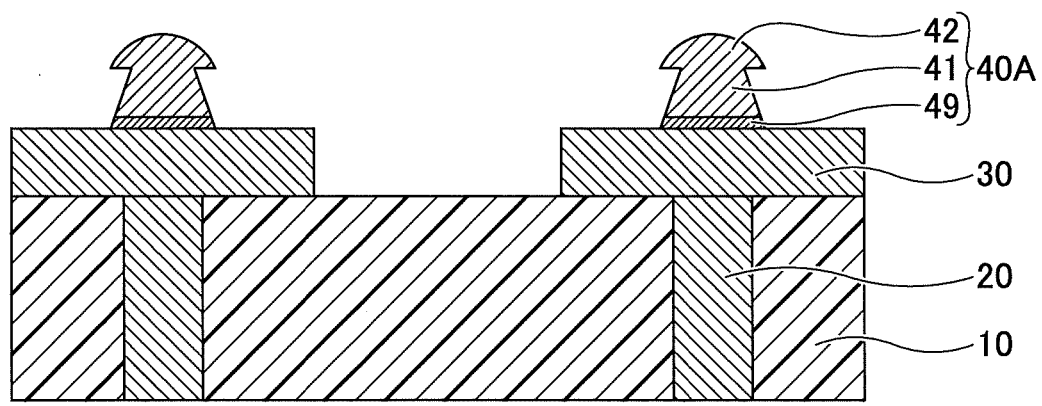

Next, in the process depicted in FIG. 4D, the resist layer 300 is removed. Then, in the process depicted in FIG. 4E, a region of the seed layer 49 not covered with the first via portion 41 is removed by etching, using the first via portion 41 as a mask. As a result, the via interconnect 40A is formed. In the case of using copper (Cu) for the seed layer 49, the seed layer 49 may be removed by wet etching, using, for example, an aqueous solution of hydrogen peroxide and sulfuric acid, an aqueous solution of sodium persulfate, or an aqueous solution of ammonium persulfate.

Thereafter, by executing the same processes as in FIGS. 2G through 2J except that the via interconnect 70A is formed in the same manner as the via interconnect 40A, the wiring substrate 1A illustrated in FIGS. 3A and 3B is completed.

According to the manufacturing method of the variation, even in the case of wiring substrates structurally prevented from feeding power from a lower wiring layer, a via interconnect including a first via portion and a second via portion can be formed on the lower wiring layer by electroplating.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a wiring substrate, including:

forming a first wiring layer on a surface of a first insulating layer;

forming a resist layer on the first insulating layer so that the resist layer covers the first wiring layer;

forming an opening in the resist layer to expose a surface of the first wiring layer, an area of a cross section of the opening increasing as a position of the cross section approaches the first wiring layer, the cross section being parallel to the surface of the first insulating layer;

forming a via interconnect of a metal by filling the opening with the metal and protruding the metal from a surface of the resist layer, the via interconnect including a first portion filling in the opening and a second portion extending from an end of the first portion in a direction away from the first wiring layer, the second portion including a curved first surface and a second surface opposite from the first surface, the second surface extending horizontally from the end of the first portion to overhang the first portion;

forming a second insulating layer on the first insulating layer after removal of the resist layer, so that the second insulating layer covers the surface of the first wiring layer, a side surface of the first wiring layer, a side surface of the first portion, the curved first surface of the second portion, and the second surface of the second portion;

exposing an end face of the second portion at a surface of the second insulating layer facing away from the first insulating layer by polishing the second insulating layer and the second portion from an opposite side from the first insulating layer; and forming a second wiring layer on the second insulating layer so that the second wiring layer connects to the first wiring layer through the via interconnect.

2. The method of clause 1, wherein the second portion is formed so that an area of a cross section of the second portion increases as a position of the cross section of the second portion approaches the first portion from the second wiring layer, the cross section of the second portion being parallel to the surface of the first insulating layer.

3. The method of clause 1, further including:

forming a seed layer so that the seed layer covers the surface of the first insulating layer, the surface of the first wiring layer, and the side surface of the first wiring layer before the formation of the resist layer, wherein after the formation of the seed layer, the resist layer is formed on the seed layer, the opening is formed in the resist layer, and the via interconnect is formed of the metal by electroplating, using the seed layer as a power feed layer.

4. The method of clause 1, wherein the resist layer is formed of a photosensitive resin, and the opening is formed so that the area of the cross section of the opening increases as the position of the cross section approaches the first wiring layer, by controlling an amount of exposure of the photosensitive resin to light.

What is claimed is:

1. A wiring substrate comprising:
a first wiring layer on a surface of a first insulating layer;
a via interconnect on a surface of the first wiring layer, the via interconnect including
a first portion connected to the first wiring layer; and
a second portion formed together with the first portion as one piece, the second portion extending from an end of the first portion in a direction away from the first wiring layer;
a second insulating layer on the first insulating layer, the second insulating layer covering the surface of the first wiring layer, a side surface of the first wiring layer, and a side surface of the via interconnect; and
a second wiring layer on the second insulating layer and in contact with a first surface of the second portion of the via interconnect,
wherein each of the first portion and the second portion is buried in the second insulating layer,
wherein a thickness of the second insulating layer between the first wiring layer and the second wiring layer is equal to a height of the via interconnect from the surface of the first wiring layer,
wherein an area of a cross section of the first portion increases as a position of the cross section approaches the first wiring layer from the second portion, the cross section being parallel to the surface of the first insulating layer; and
wherein the second portion includes a second surface opposite from the first surface thereof, the second surface extending horizontally from the end of the first portion to overhang the first portion.

2. The wiring substrate as claimed in claim 1, wherein an area of a cross section of the second portion increases as a position of the cross section of the second portion approaches the first portion from the second wiring layer, the cross section of the second portion being parallel to the surface of the first insulating layer.

3. The wiring substrate as claimed in claim 1, wherein the via interconnect further includes a seed layer between the first portion and the first wiring layer.

4. A wiring substrate comprising:
a first wiring layer on a surface of a first insulating layer;
a second insulating layer on the first wiring layer;
a second wiring layer on the second insulating layer; and
a via interconnect buried in the second insulating layer and contacting a surface of the first wiring layer and the second wiring layer, the via interconnect including a side surface that is stepped to form a projection,
wherein a thickness of the second insulating layer between the first wiring layer and the second wiring layer is equal to a height of the via interconnect from the surface of the first wiring layer, and
wherein an area of a cross section of the via interconnect increases as a position of the cross section approaches the first wiring layer from the projection, the cross section being parallel to the surface of the first insulating layer.

5. The wiring substrate as claimed in claim 4, wherein the projection extends parallel to the surface of the first insulating layer.

6. The wiring substrate as claimed in claim 4, wherein the via interconnect includes a seed layer contacting the first wiring layer.

* * * * *